United States Patent [19]

Walwyn et al.

[11] 4,443,098
[45] Apr. 17, 1984

[54] PELLICLE MOUNTING FIXTURE

[75] Inventors: Craig M. Walwyn; Donald E. Bohonos, both of San Jose, Calif.

[73] Assignee: General Signal Corporation, Stamford, Conn.

[21] Appl. No.: 451,780

[22] Filed: Dec. 21, 1982

[51] Int. Cl.³ ............................................ G03B 27/58
[52] U.S. Cl. ............................................................ 355/74
[58] Field of Search .................................. 355/72, 74

[56] References Cited

U.S. PATENT DOCUMENTS

| 1,818,528 | 8/1931 | Bern | 355/72 |
| 3,957,371 | 5/1976 | Rich | 355/74 |

*Primary Examiner*—Monroe H. Hayes
*Attorney, Agent, or Firm*—Charles H. Schwartz; Ellsworth R. Roston; Thomas R. Fitzgerald

[57] ABSTRACT

The pellicle mounting fixture for affixing a pellicle to a mask, including a first support and a second support member and with the first member for receiving a pellicle and with the second member for supporting a mask, a guide structure connected to the first member and the second member for providing rotational movement between the first and second members between an upstanding position for one of the members relative to the other member and a spaced parallel position between the first and second members and for providing lateral movement between the first and second members between the spaced parallel position and a touching parallel position between the first and second members, and resilient structure connected to one of the members and projecting outwardly to engage the other member during lateral movement between the first and second members.

26 Claims, 8 Drawing Figures

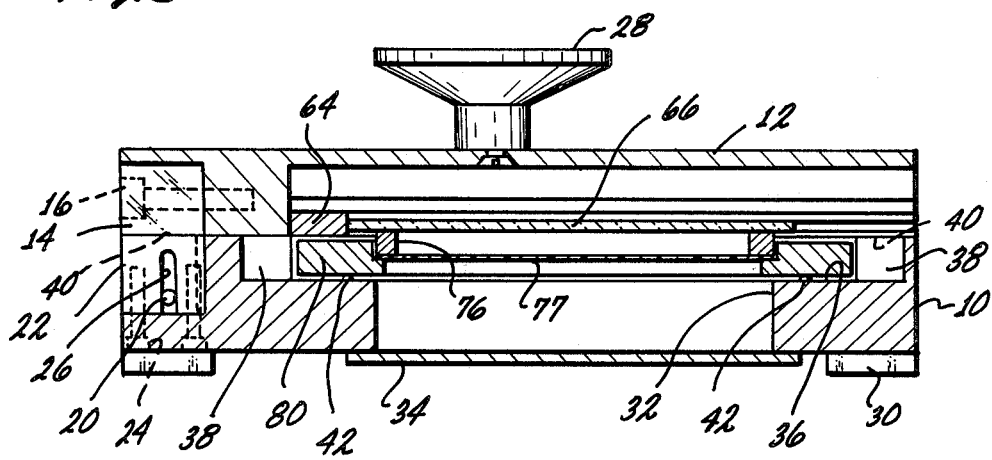
FIG. 6
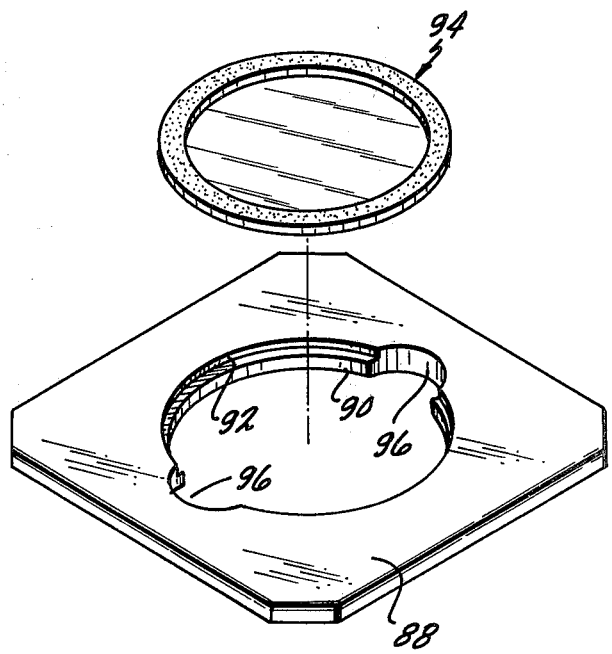
FIG. 7
FIG. 8

PELLICLE MOUNTING FIXTURE

BACKGROUND OF THE INVENTION

1. Field of the Invention

The present invention relates to a pellicle mounting fixture and specifically to a fixture for accurately positioning a mask adjacent to a pellicle so that the pellicle may be adhesively affixed to the mask.

2. Description of the Prior Art

A pellicle, in the form of a thin transparent membrane, is used in the semi-conductor industry to protect the surface of a photographic mask. The masks are used as part of the process of producing various semi-conductor devices such as integrated circuits. If any dust or particles fall onto the surface of the mask this will produce an inaccurate reproduction from the mask including spots representing the dust or particles. Therefore, in order to protect the mask from dust or other particles, a thin transparent membrane is positioned adjacent to and spaced from the mask so that any dust or other particles will fall onto the membrane rather than the mask. Since the dust or other particles and now maintained at a position spaced from the mask, the dust and other particles will be out of focus when the mask is used in the process of producing semi-conductor devices.

The pellicles of the prior art are generally formed with a frame member supporting the thin transparent membrane, and with the frame member attached to the mask by an adhesive so that the membrane is maintained in a fixed spaced relationship with the mask. If desired, pellicles may be affixed on both sides of the mask or may be affixed only on a single side of the mask.

In the prior art, the pellicles have usually been affixed either manually or by using very simple pin fixtures to guide the pellicle and mask toward each other. In either case, the placement of the pellicle is not accurately repeatable and the pressure used to affix the pellicle to the mask can vary widely. In addition, the prior art methods and structures do not provide for easy adaptability for different size pellicles or different size masks so that the prior art structures are generally not reliable in use.

SUMMARY OF THE INVENTION

The present invention is directed to a pellicle mounting fixture including a lower base adapted to receive different size pellicles and with a hinged cover adapted to receive different size masks. The hinge arrangement between the cover and the base includes a unique guide structure to allow both a rotational movement between the cover and base and also, when desired, a transverse movement between the lower base and the cover so that the cover may be moved closer to the base to affix the pellicle to the mask and may be moved away from the base to extract the pellicle from the base. The pellicle mounting fixture of the present invention includes spring loaded plungers to insure that the pressure required to affix the pellicle to the mask is essentially the same for all pellicles.

The fixture of the present invention includes adapters so that the mounting fixture will accept masks of different sizes such as both four (4) inch and five (5) inch masks and also masks of different thicknesses. In addition, ball detents are included to insure that the masks are locked in position. The fixture also includes mounting plates to accommodate different size pellicles. Finger holes are included so as to provide for easy removal of the mounting plates.

The present invention therefore provides for a small lightweight fixture which requires very little counter space and which allows for a pellicle to be affixed to a mask and with the placement of the pellicle repeatable within a high accuracy, such as one hundredth (0.01) of an inch. Other features of the present invention are the use of a removable plate on the base so as to allow for the use of a bottom light source to detect any dust or other particles prior to the affixing of the pellicle to the mask.

BRIEF DESCRIPTION OF THE DRAWINGS

A clearer understanding of the invention will be had with reference to the following description and drawings wherein

FIG. 6 illustrates a side cross-sectional view of the mounting fixture illustrating the cover plate fully engaging the first and second groups of spring loaded plungers and with the pellicle affixed to the mask;

FIG. 7 illustrates an alternate mounting plate for use with a different shaper pellicle; and FIG. 8 illustrates a side cross-sectional view of an adapter plate for use in mounting a different size mask.

DESCRIPTION OF THE PREFERRED EMBODIMENT

Figure 1:
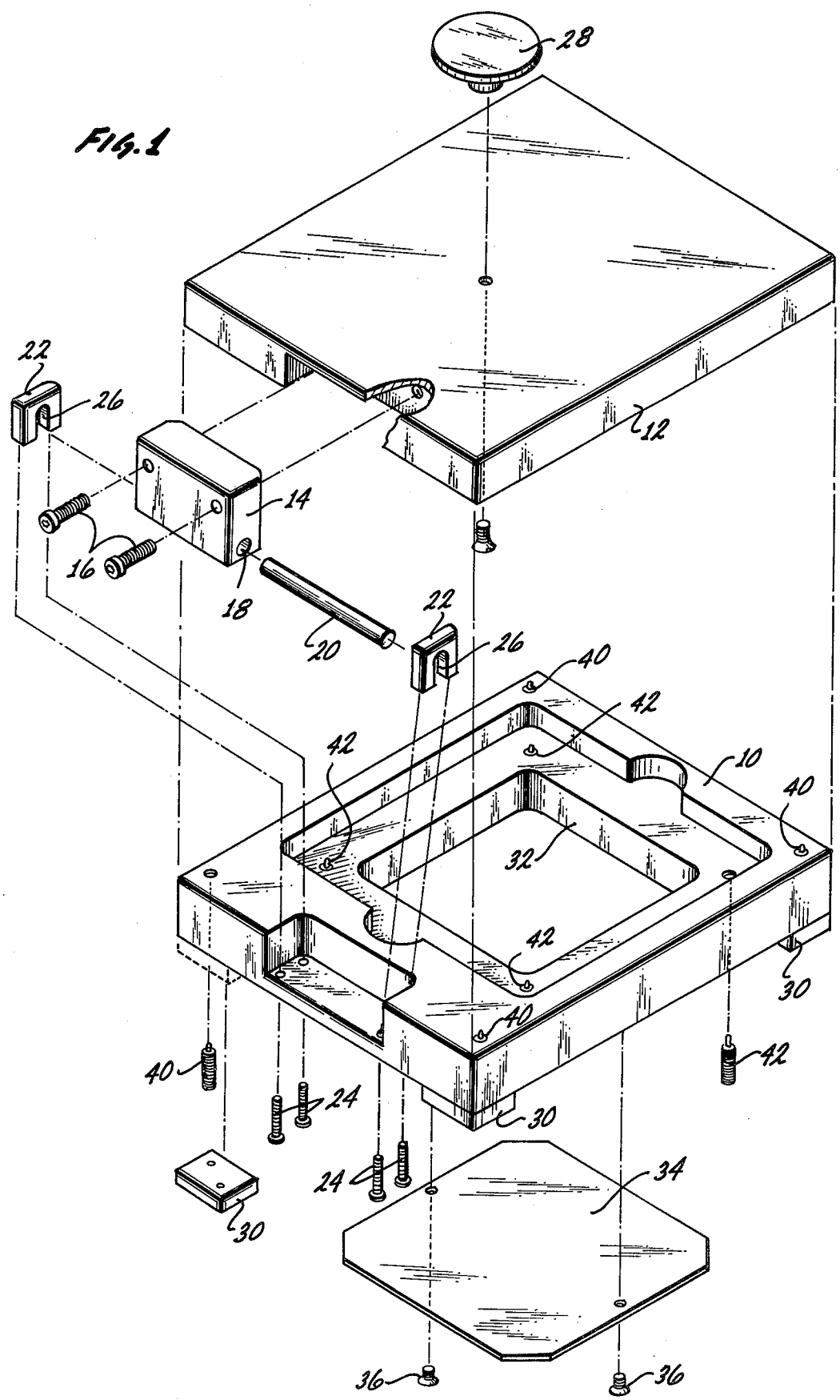
FIG. 1 is an exploded perspective view of the mounting fixture of the present invention.
Figure 2:
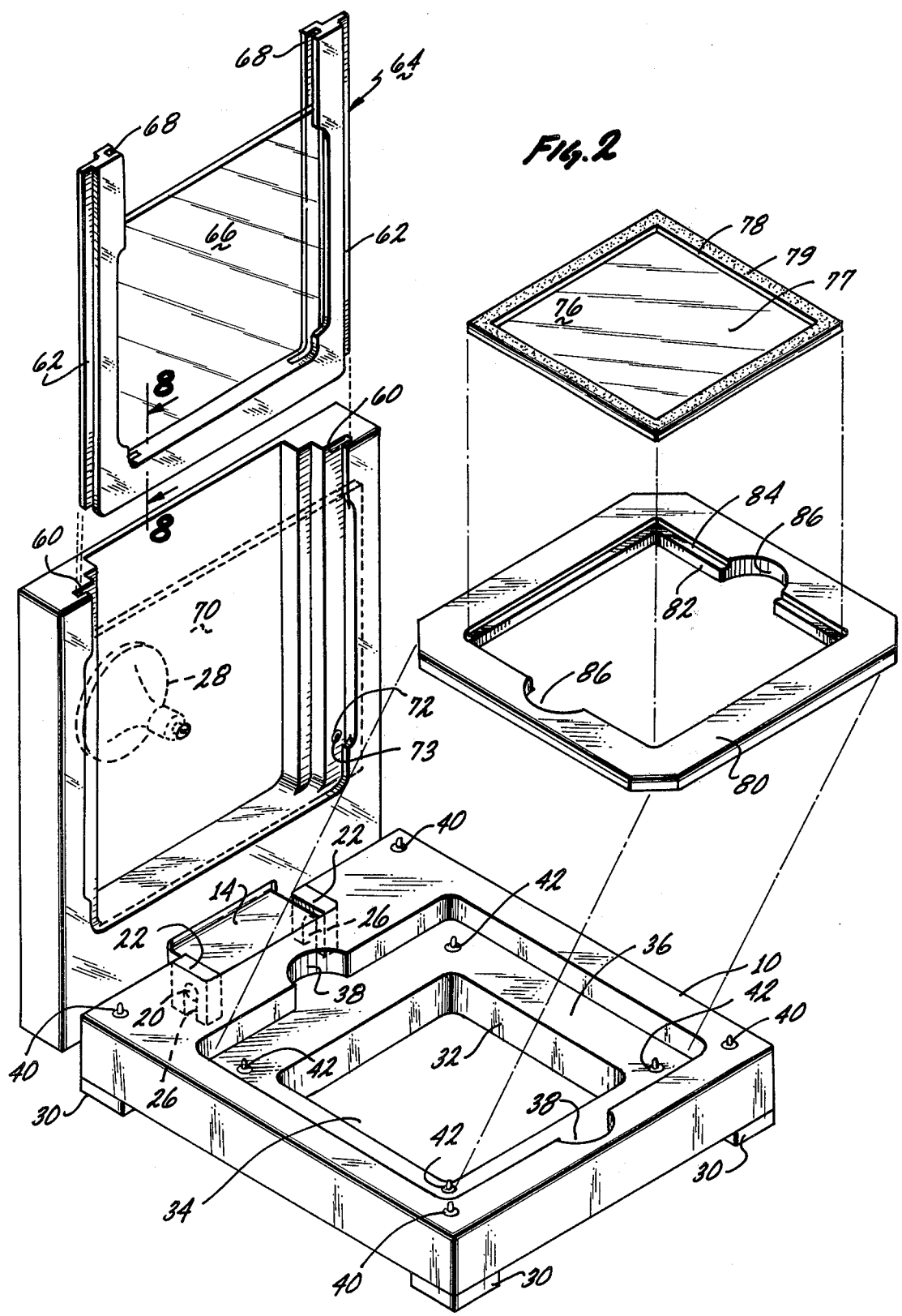
FIG. 2 is an assembled perspective view of the mounting fixture of the present invention.

FIG. 1 illustrates an exploded view of the pellicle mounting fixture of the present invention for use in affixing a pellicle to a mask. FIG. 2 illustrates a perspective view of the assembled pellicle mounting fixture and showing a mask and pellicle for insertion into the fixture. As shown in FIGS. 1 and 2, the pellicle mounting fixture includes a lower base 10 and a hinged cover 12. The cover 12 is hinged to the base 10 through the use of a guide block 14 and with the guide block mounted to the cover 12 by screws 16. The guide block 14 also includes an opening 18 which opening 18 receives a dowel pin 20. A pair of insert blocks 22 are mounted to the lower base 10 through the use of screws 24. The insert blocks 22 include slotted openings 26 which slotted openings also receive the dowel pin 20.

Figure 3:
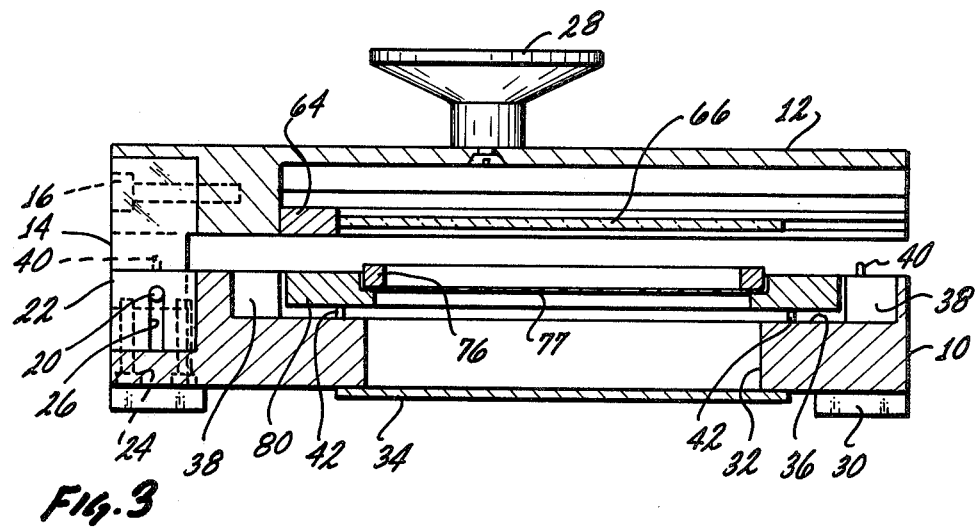
FIG. 3 illustrates a side cross-sectional view of the mounting fixture of the present invention after rotation of the cover member and before transverse movement of the cover member towards the base member.
Figure 5:
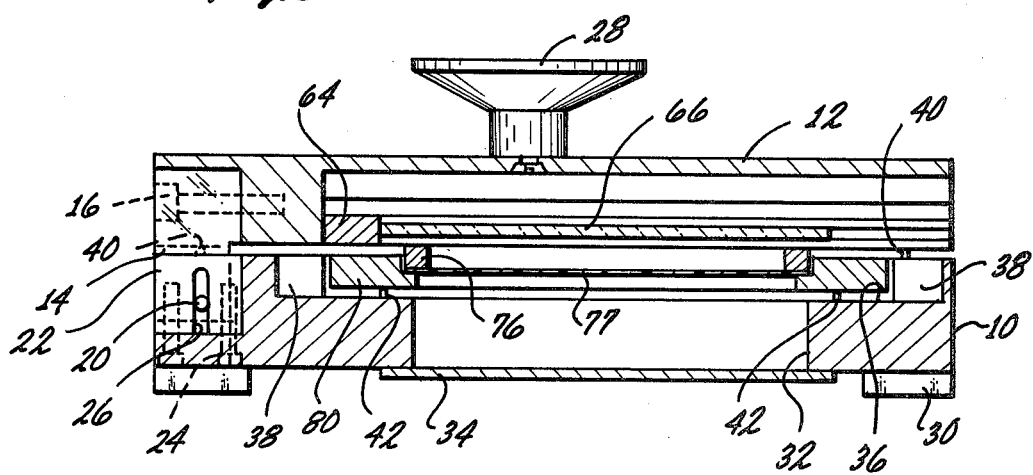
FIG. 5 illustrates a side cross-sectional view of the mounting fixture illustrating the cover member initially engaging a first group of spring loaded plungers.

The guide block 14 may therefore rotate about the dowel pin 20 and with the dowel pin 20 also sliding in the slotted openings 26 in the insert blocks 22. The cover 12 may therefore be rotated between the position shown in FIG. 2 and the position shown in FIG. 3. As shown in FIG. 3 the lower base 10 and cover 12 are spaced from each other and are in substantially parallel planes. The cover 12 may also be moved in a transverse direction relative to the base 10, as shown in FIGS. 5 and 6, to provide for the transfer of a pellicle to a mask.

The cover 12 may include a hand knob 28 to facilitate the movement of the cover relative to the base 10.

The base 10 also includes four (4) base pads 30 or feet to support the base 10. The base 10 may also include an opening 32 and with a base plate 34 covering the opening 32. The base plate may be removable, such as by screws 36, so that the base may be accessible to allow for the use of a bottom light source through the opening 32.

The base 10 also includes a stepped portion 36 and with the stepped portion including finger holes 38 which allow for easy removal of pellicle mounting plates as will be explained. Finally, the base 10 includes two (2) sets of four (4) spring loaded long nose plunger assemblies and with a first set of four (4) plunger assemblies 40 positioned to extend through the upper surface of the base 10 and a second set of four (4) spring loaded plunger assemblies 42 positioned to extend through the stepped portion 36 of the base 10.

Figure 4:
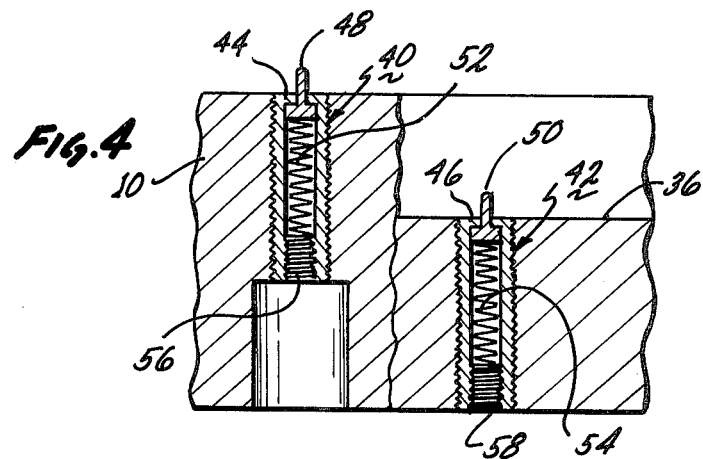
FIG. 4 illustrates a cross-sectional detailed view of the spring loaded plungers incorporated in the mounting fixture in the present invention.

As can be seen in FIG. 4, the sets of spring loaded plunger assemblies 40 and 42 are formed by threaded body members 44 and 46. Plungers 48 and 50 are received within the threaded body members 44 and with spring members 52 and 54 providing spring loading for the plungers 48 and 50. The plungers and springs are captured by threaded plugs 56 and 58. Progressive force on the tips of the plungers 48 and 50 of the plunger assemblies 40 and 42 therefore provide for the plungers to be received within the body portions 44 and 46. Plungers assemblies 40 and 42 therefore provide for a predetermined resilient force to resist the cover 12 as the cover is pushed downward by the knob 28.

As shown in FIGS. 2, 3, 5 and 6, the pellicle mounting fixture is designed to receive a pellicle and a mask so as to affix the pellicle to the mask. Specifically, the cover 12 includes a stepped recess including slots 60. The slots 60 receive either the edges of a mask 70 or receive complimentary edge portions 62 on both sides of a mask holder 64. The mask holder 64 forms an adaptor plate which is used to support a mask 66 of a particular size such as a four (4) inch mask. The larger size mask 70 such as a five (5) inch mask, is received directly and if such a five (5) inch mask is used there is no need to use the mask holder 64.

The mask 66 is held within slots 68 and the thickness of the slots 68 is designed to accommodate the particular thickness of the mask 66. Typically four (4) inch masks come in two (2) thicknesses, either nine hundreths (0.09) or six hundreths (0.06) of an inch. Typically the five (5) inch masks 70 have a thickness of nine hundreths (0.09) of an inch so that the slots 60 in the cover 12 have this dimension so as to receive the five (5) inch mask.

In order to lock the five (5) mask 70 or the mask holder 64, which accommodates the four (4) inch mask 66, in place within the cover 12, a ball detent assembly 72 may be used. The ball detent assembly 72 would be similar in construction to the spring loaded plunger assemblies 40 and 42 but would have a small protruding ball member 73 instead of a long plunger. When the mask 70 is slid into the slots 60, the ball member 73 is retracted and provides for pressure against the mask 70 to maintain the mask in position. The mask holder 64 is also retained in a similar fashion but the mask holder 64 may include a recess complementary in position to the position of the ball detent assembly 72. The recess insures that the mask holder 64 will lock in position.

In order to insure that the mask 66 will lock in position within the slots 68 of the mask holder 64, the mask holder 64 also includes a ball detent assembly 74. FIG. 8 illustrates a cross-sectional view taken along lines 8—8 of FIG. 2 and illustrating the use of the ball detent assembly 74 which includes a retractable ball member 75. The retractable ball member 75 puts pressure on the mask 66 when the mask is positioned within the groove 68. As shown in FIG. 8, the mask 66 is shown partially slid in position but prior to engaging the ball 75. In either case where the larger size mask 70 is positioned directly in the slots 60 or where the smaller size mask 66 is held in the mask holder 64 which in turn is positioned in the slots 60, the cover 12 supports and locks masks in essentially the same position for use in the pellicle mounting fixture of the present invention.

Also as shown in FIG. 2, a pellicle 76 is formed by a thin membrane of transparent material 77 supported by a frame 78. The frame 78 includes a layer of an adhesive material 79 on the surface of the frame 78 opposite to the transparent membrane material 77. The pellicle 76 is received within a pellicle holder 80 which holder 80 has an outside configuration to conform to the inside configuration of the step portion 36 of the base 10. The pellicle holder 80 has an opening 82 and with the opening including a stepped portion 84 to conform to the outside size of the pellicle 76.

Recesses 86 form finger holes for easy insertion or removal of the pellicle 76. The pellicle 76 is thereby received within the pellicle holder 80 and the holder 80 is received within the lower base 10. It is to be appreciated that other pellicle holders may be used to receive pellicles of different sizes and shapes. For example, as shown in FIG. 7, a pellicle holder 88 includes a circular opening 90 with a stepped portion 92 so as to receive a circular pellicle 94. The holder 88 may include finger holes 96 to aid in the insertion or removal of the pellicle 94.

FIGS. 3, 5 and 6 are shown with the cover receiving the mask holder 64 and the smaller size mask 66 and with the base receiving the pellicle holder 80 with the square pellicle 76. It is to be appreciated however, that the cover 12 may receive other mask holders or may directly receive a larger size mask 70 and that the base 10 may receive different pellicle adaptor plates forming holders to accommodate different size and shape pellicles, such as the circular pellicle 90 shown in FIG. 7.

In general, the initial steps in the operation of the fixture of the present invention include placing the cover 12 in the open position as shown in FIG. 2. The appropriate pellicle holder is placed in the opening in the base 10 and the appropriate mask or mask holder is slid into the slots 60 in the cover 12 and with the ball detent 72 securing the mask in position.

Once the mask and pellicle have been placed in the proper positions then generally a light source (not shown) is directed to the mask and pellicle for visual inspection. The light inspection is to detect any dust or particles will so that they can be removed such as through the use of a low pressure air gun. It may be desired to permanently secure a light source at a bottom position and in such a case the base plate 34 is removed to allow the light to shine upward.

Once the mask and pellicle have been cleansed of any dust or particles, the cover 12 is firmly grasped by the hand knob 28 and rotated to a horizontal position as shown in FIG. 3. The guide block 14 initially provides for the cover 12 and base 10 to be spaced from each other as shown in FIG. 3. The cover 12 is now pressed downward through an intermediate position, as shown in FIG. 5, to a full stop position, as shown in FIG. 6. As can be seen in FIG. 5, the cover 12 initially contacts the plunger assemblies 40 while the pellicle holder 80 engages the plunger assemblies 42.

As the cover 12 is continued to be pressed downward to the full stop position, as shown in FIG. 6, the long nose plungers 48 become fully recessed within the base 10 and the long nose plungers 48 become at least partially recessed as the frame portion 78 of the pellicle 76 engages the surface of the mask 66. Specifically, the adhesive surface 79 of the pellicle 76 engages the mask so that the pellicle now becomes affixed to the mask 66. The plunger assemblies 40 and 42 accommodate any slight irregularities between the frame 78 of the pellicle 76 and the surface of the mask 66 so as to insure that there is equal contact pressure around the complete perimeter of the frame 78 of the pellicle 76. The plunger assemblies 40 and 42 also insure that the pressure is essentially the same as additional pellicles are affixed to additional masks.

When the cover 12 is released, the plunger assemblies 40 and 42 exert upward force to push the cover back to the upward position as shown in FIG. 5 and the cover is now lifted free by the hand knob 28 to the position shown in FIG. 3 wherein the pellicle 76 is completely free of the pellicle holder 80. The cover 12 may now be rotated back to the open position as shown in FIG. 2. The mask may now be slid out of the cover 12 with the pellicle attached.

The present invention is therefore directed to a pellicle mounting fixture for providing for the transfer of a pellicle from a particular position to be affixed to a mask. The mounting fixture is small, lightweight and easily stored and requires very little counter space for usage. The fixture will accept different size masks through the use of mask holders and different size and shape pellicles through the use of different pellicle holders. The pellicle placement is repeatable to a high accuracy such as one hundreth (0.01) of an inch. Pellicles may be affixed to both sides of the mask by first affixing one pellicle and then reversing the mask in the cover and affixing a second pellicle to the other side of the mask. The pressure required to affix the pellicle to the mask is esstentially the same for all masks and pellicles.

Although the invention has been described with reference to a particular embodiment, it is to be appreciated that various adaptations and modifications may be made and the invention is only to be limited by the appended claims.

We claim:

1. A pellicle mounting fixture for affixing a pellicle to a mask, including
    a base member and a cover member and with the base member including means for receiving a pellicle and with the cover member including means for supporting a mask,
    a guide means connected to the base member and the cover member for providing rotational movement between the cover member and the base member between an upstanding position for the cover member relative to the base member and a spaced parallel position between the cover member and the base member and for providing transverse movement between the cover member and the base member between the spaced parallel position and a touching parallel position between the cover member and the base member, and
    resilient means connected to the base member and projecting upwardly to engage the cover member during transverse movement between the cover member and the base member.

2. The pellicle mounting fixture of claim 1 wherein the means for receiving the pellicle includes a stepped opening and with the pellicle fitting within and retained in position by the opening prior to affixing the pellicle to the mask.

3. The pellicle mounting fixture of claim 2 wherein the opening includes at least one finger hole recess adjacent a side of the opening to facilitate placement of the pellicle.

4. The pellicle mounting fixture of claim 2 additionally including a pellicle mounting plate having a stepped opening and with the pellicle fitting within and retained in position by the opening in the mounting plate and with the mounting plate fitting within and retained in position by the opening in the base member.

5. The pellicle mounting fixture of claim 4 wherein both openings each include at least one finger hole recess adjacent a side of each opening to facilitate placement of the pellicle and the mounting plate.

6. The pellicle mounting fixture of claim 1 wherein the means for receiving the pellicle includes an opening through the base member and additionally including a removable bottom cover for the opening for allowing the use of a bottom light source.

7. The pellicle mounting fixture of claim 1 wherein the means for supporting includes a recess and with slots on opposite sides of the recess for allowing the mask to be slid into and be retained by the slots.

8. The pellicle mounting fixture of claim 7 additionally including at least one ball detent located adjacent at least one slot to lock the mask in position.

9. The pellicle mounting fixture of claim 7 additionally including an adaptor plate including slots on opposite sides and with the mask slid into and retained by the slots in the adaptor plate and with the adaptor plate slid into and retained by the slots in the recess in the cover member.

10. The pellicle mounting fixture of claim 9 additionally including at least one ball detent located adjacent at least one slot in each pair to lock the adaptor plate and mask in position.

11. The pellicle mounting fixture of claim 1 wherein the guide means includes a guide block mounted on the cover member and at least one insert block mounted on the base member and with the guide block including a circular opening and the insert block including an elongated opening and with a dowel pin passing through the circular opening and the elongated opening for providing both rotational and transverse motion between the cover and base members.

12. The pellicle mounting fixture of claim 1 wherein the resilient means include a plurality of spaced spring loaded plungers mounted in the base member to project above the surface of the base member.

13. The pellicle mounting fixture of claim 12 wherein the means for receiving the pellicle includes a stepped opening and additionally including a plurality of spaced spring loaded plungers mounted in the stepped opening to project above the surface of the stepped opening to urge the pellicle upward.

14. The pellicle mounting fixture for affixing a pellicle to a mask, including a first support and a second support member and with the first member for receiving a pellicle and with the second member for supporting a mask, a guide structure connected to the first member and the second member for providing rotational movement between the first and second members between an upstanding position for one of the members relative to the other member and a spaced parallel position between the first and second members and for providing transverse movement between the first and second members between the spaced parallel position and a touching parallel position between the first and second members, and resilient structure connected to one of the members and projecting outwardly to engage the other member during transverse movement between the first and second members.

15. The pellicle mounting fixture of claim 1 wherein the first member includes a stepped opening and with the pellicle fitting within and retained in position by the opening prior to affixing the pellicle to the mask.

16. The pellicle mounting fixture of claim 15 wherein the opening includes at least one finger hole recess adjacent a side of the opening to facilitate placement of the pellicle.

17. The pellicle mounting fixture of claim 15 additionally including a pellicle mounting plate having a stepped opening and with the pellicle fitting within and retained in position by the opening in the mounting plate and with the mounting plate fitting within and retained in position by the opening in the first member.

18. The pellicle mounting fixture of claim 17 wherein both opening each include at least one finger hole recess adjacent a side of each opening to facilitate placement of the pellicle and the mounting plate.

19. The pellicle mounting fixture of claim 15 wherein the second member includes an opening through the first member and additionally including a removable bottom cover for the opening for allowing the use of a bottom light source.

20. The pellicle mounting fixture of claim 15 wherein the second member includes a recess and with slots on opposite sides of the recess for allowing the mask to be slid into and be retained by the slots.

21. The pellicle mounting fixture of claim 20 additionally including at least one ball detent located adjacent at least one slot to lock the mask in position.

22. The pellicle mounting fixture of claim 20 additionally including an adaptor plate including slots on opposite sides and with the mask slid into and retained by the slots in the adaptor plate and with the adaptor plate slid into and retained by the slots in the recess in the second member.

23. The pellicle mounting fixture of claim 22 additionally including at least one ball detent located adjacent at least one slot in each pair to lock the adaptor plate and mask in position.

24. The pellicle mounting fixture of claim 15 wherein the guide structure includes a guide block mounted on one of the members and at least one insert block mounted on the other member and with the guide block including a circular opening and the insert block including an elongated opening and with a dowel pin passing through the circular opening and the elongated opening for providing both rotational and transverse motion between the first and second members.

25. The pellicle mounting fixture of claim 15 wherein the resilient structure include a plurality of spaced spring loaded plungers mounted in the one of the members to project above the surface of the one member.

26. The pellicle mounting fixture of claim 25 wherein the first member includes a stepped opening and additionally including a plurality of spaced spring loaded plungers mounted in the stepped opening to project above the surface of the stepped opening to urge the pellicle upward.

* * * * *